United States Patent [19]
Scheraga

[11] Patent Number: 5,903,425
[45] Date of Patent: May 11, 1999

[54] LATERAL PNP FAST TURN-OFF CIRCUIT

[75] Inventor: William J. Scheraga, Warwick, R.I.

[73] Assignee: Cherry Semiconductor Corporation, East Greenwich, R.I.

[21] Appl. No.: 08/867,120

[22] Filed: Jun. 2, 1997

[51] Int. Cl.$^6$ .................................................. H02H 3/00
[52] U.S. Cl. ........................... 361/111; 361/18; 361/56; 361/101
[58] Field of Search ............................... 361/56, 91, 111, 361/117, 118, 119, 18, 101

[56] References Cited

U.S. PATENT DOCUMENTS 4,375,074   2/1983   Glogolja ..................................... 361/91

*Primary Examiner*—Jeffrey Gaffin
*Assistant Examiner*—Stephen Jackson
*Attorney, Agent, or Firm*—Bromberg & Sunstein LLP

[57] ABSTRACT

A control circuit for providing fast turn-off of a PNP transistor with output transient protection. An embodiment of the invention provides a current amplifier coupled between a positive voltage supply line and the base of a PNP switching transistor and an input device for providing an input current to the current amplifier. The current amplifier provides a transitory reverse drive current to the base of the PNP switching transistor. The current amplifier and the input device both include transient blocking junctions that block current flow from a positive voltage transient in excess of the positive supply voltage. The current amplifier is a PNP drive transistor in the preferred embodiment. The PNP drive transistor provides a transitory reverse drive current to the base of the PNP switching transistor. Control of the PNP drive transistor can be provided by a capacitor coupled between an input node and the base of an NPN transistor, the collector of the NPN transistor providing an amplified capacitor current to the base of the PNP drive transistor. A switching signal on the input node intermittently switches on and off a current source which intermittently drives the PNP switching transistor.

39 Claims, 3 Drawing Sheets

LATERAL PNP FAST TURN-OFF CIRCUIT

BACKGROUND OF THE INVENTION

The present invention relates to a control circuit for speeding up the turn-off time of a PNP transistor. In particular, the embodiments of the invention include a circuit that reduces both the delay to the start of the transition time and the transition time from an on state to an off state of a PNP transistor. This application is related to the inventor's copending application entitled "Lateral PNP Fast Turn-On Circuit" having the same filing date as the present application.

PNP transistors are often employed as switching elements in integrated circuits. Typically, during normal switching, the PNP transistor is cycled "on" and "off" to control the flow of current between the emitter and collector by intermittently supplying a forward biasing or drive current to the transistor. The transistor is turned "on" by base drive current and turned "off" by removing the base drive current. During "on" periods, an amount of charge is stored in the base of the transistor. When the drive current is removed, the emitter base junction of the PNP transistor is caused to remain forward biased for a period of time by the stored charge, and the transistor continues to conduct current between the emitter and collector during the time required for the stored charge to decay. The stored charge increases the time for the transistor to transition from a conducting state to a nonconducting state, resulting in delayed switching. When the transistor is driven into saturation by the base drive, the charge stored in the base must be discharged before any reduction in the current conducted between the emitter and collector of the transistor can take place following the removal of the drive current. The delay in transition time and the transition time itself may each be up to several microseconds long. These relatively long time periods reduce the maximum switching speed of the PNP transistor.

The discharge period of the stored charge can be reduced by applying a reverse drive current to the base of the switching PNP transistor. The greater the level of reverse drive current, the faster the base stored charge will be discharged and the faster the transistor will turn "off." To drive the PNP transistor quickly into a nonconducting state, the reverse drive current must be able to drive the base voltage of the PNP transistor close to the level of the voltage at its emitter.

Circuits have been developed in the past for decreasing the switching time of a transistor. For example, U.S. Pat. No. 4,487,520 (O'Neill et al.) and U.S. Pat. No. 5,128,553 (Nelson) both describe circuits which generate a reverse drive current to speed up the switching speed of a PNP transistor from the "on" state to the "off" state. These two patents disclose the use of an NPN transistor to provide a reverse drive current to the base of a PNP switching transistor. In certain circuit environments such as in automotive uses, the output at the collector of the PNP transistor may be subjected to high voltage transients. Voltage transients of up to ±40 volts may be found in an automotive environment for example. The circuits disclosed in the patents to Nelson and O'Neill et al. can only withstand a positive voltage differential from output to the positive voltage supply V+ of about 8–9 volts without damage to the circuitry. The relevant portions of the circuitry in these two patents subjecting them to vulnerability to large positive voltage differentials is the same. The emitter of an NPN drive transistor is connected to the base of the PNP switching transistor. The collector of the NPN transistor is tied to the positive voltage supply V+ and the base is connected to the cathode of a diode. As the voltage at the collector of the PNP transistor increases with respect to the positive voltage supply V+ due to a transient event, the path for the current to flow from the collector of the PNP transistor to the positive voltage supply is through the forward-biased collector-base junction of the PNP switching transistor and then through the reverse-biased emitter-base junction of the NPN drive transistor and finally through the forward-biased base-collector junction of the NPN transistor to the positive supply voltage V+. The two forward-biased junctions have a voltage drop across them of about 0.7 volts each and the breakdown voltage of the emitter-base junction of the NPN drive transistor in this type of bipolar technology is about 7 volts. This total voltage drop is thus about 8.4 volts. If the transient voltage on the output terminal at the collector of the PNP transistor rises above the positive voltage supply V+ by a level greater than this 8.4 volts, the emitter-base junction of the NPN transistor will fail catastrophically. The path for the current in this situation has no limiting resistance in the path so the weakest link, the emitter-base junction, will overheat from the high current and fail catastrophically.

SUMMARY OF THE INVENTION

An embodiment of the present invention is directed to a PNP transistor control circuit for controlling a PNP switching transistor coupled to a positive voltage supply line. A current amplifier is used to provide a transitory reverse drive current to the base of the PNP switching transistor. A transient blocking junction is included in the current amplifier and in an input device coupled to the current amplifier to block current flow from a positive voltage transient at the collector of the PNP switching transistor. A switching signal operates a current source coupled to the base of the PNP switching transistor to intermittently drive the PNP switching transistor. In embodiments of the invention, the current amplifier includes a PNP drive transistor having an emitter coupled to the positive voltage supply and a collector coupled to the base of the PNP switching transistor. More particularly, the current source may be coupled to an input node on which the switching signal is applied. A capacitor may be further coupled between the input node and the PNP drive transistor in parallel with a current source. The capacitor passes a capacitor current when the switching signal on the input node switches from the first state which holds the PNP switching transistor "on" to a second state which holds the PNP switching transistor "off." In more particularity, an NPN transistor with a base coupled to the capacitor and a collector coupled to the base of the PNP drive transistor provides an amplified capacitor current to the base of the PNP drive transistor. The collector-emitter circuit of the NPN transistor acts as a transient blocking junction in the absence of the capacitor current.

Embodiments of the invention advantageously provide a transitory reverse drive current to accelerate the turn-off time of the PNP switching transistor. In the event a positive voltage transient of up to about 40 volts is applied at the collector of the PNP switching transistor, embodiments of the circuit are given in which current flow from the transient will be blocked to protect circuit components. Other objects and advantages of the invention will become apparent during the following description of the presently preferred embodiments of the invention taken in conjunction with the drawings.

DETAILED DESCRIPTION OF THE PREFERRED EMBODIMENTS

Figure 1:
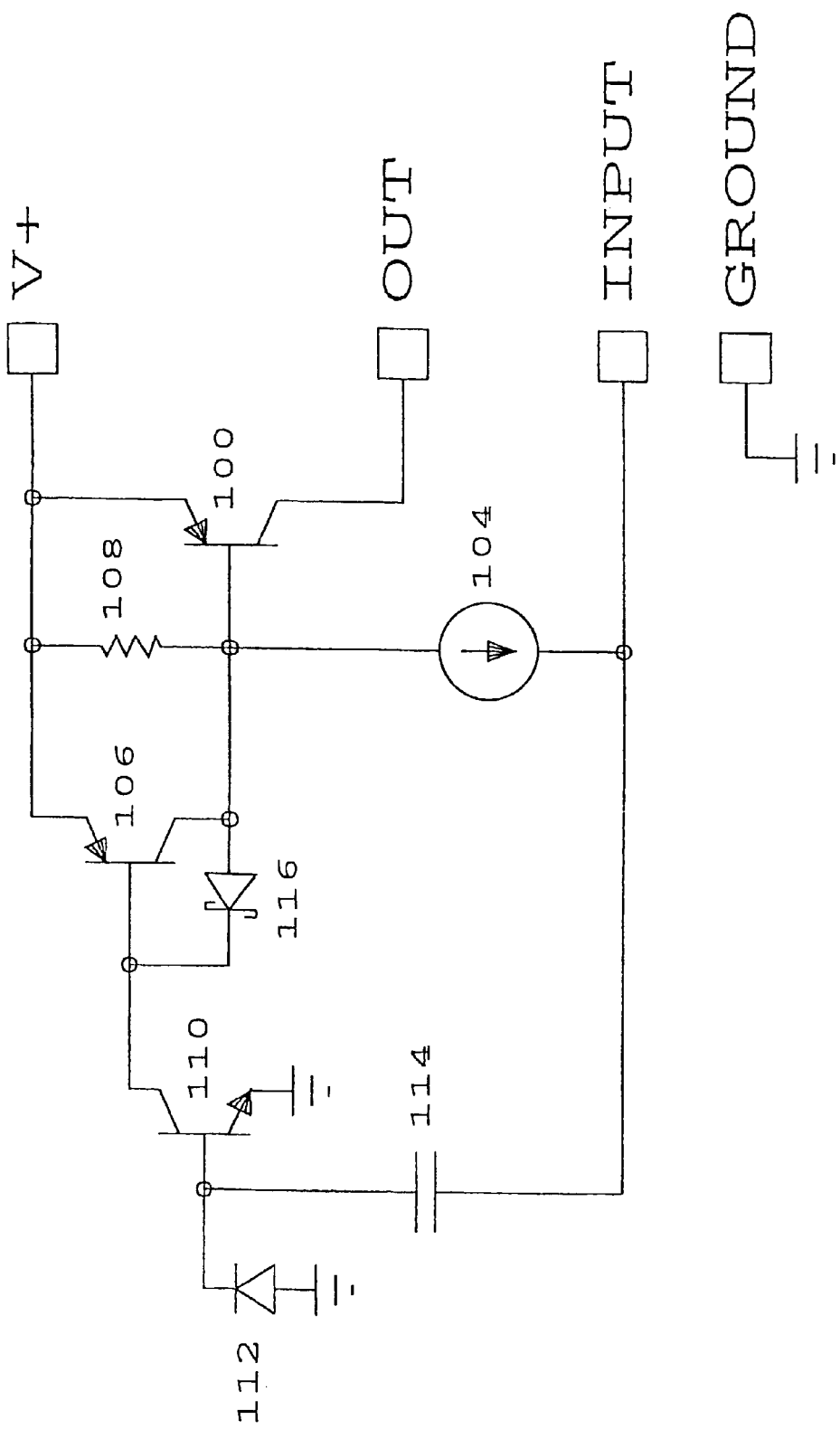
FIG. 1 is a schematic diagram of a first embodiment of the circuit of the invention.

Referring now to FIG. 1, a PNP switching transistor 100 is controlled by an embodiment of the invention for an accelerated turn-off time. A conventional base-emitter resistor 108 aids in the turn-off of the PNP transistor 100 and ensures that it remains off when no drive current is available. The emitter of the PNP transistor 100 is connected to a positive voltage supply line with a positive voltage V+. The output is taken from the collector of the PNP transistor 100. The PNP transistor 100 is controlled through its base drive current.

Conventional control of PNP switching transistor 100 is provided by a switching signal. In FIG. 1, the switching signal is applied to an input terminal. The conductors connected at the input terminal are referred to herein as an input node. Base drive current for the PNP transistor 100 is sourced through a current source 104. The current source 104 is on when the input node is low. The current source then conducts a steady state current that will be at least at a sufficient level to cause the PNP transistor 100 to go into saturation. When the input node switches high, the current source 104 is turned off. Thus, the current source 104 intermittently drives the PNP switching transistor 100.

In accordance with an aspect of the present invention, a current amplifier is added between the positive voltage supply line and the base of the PNP transistor 100. In the embodiment of FIG. 1, a PNP drive transistor 106 serves as the current amplifier. It is desirable that the current amplifier provide a transitory reverse drive current when the switching signal at the input node changes state, in the embodiment shown that is from low to high. The low state of the input switching signal has a voltage at or near ground. The high state of the input switching signal has a voltage approximately equal to the positive voltage on the positive voltage supply line. The transitory reverse drive current is used to accelerate the turn-off time of the PNP transistor 100.

In accordance with a further aspect of the present invention, a base-emitter junction of the PNP drive transistor 106 acts as a transient blocking junction. Positive voltage transients at the collector of PNP transistor are prevented from causing a current through PNP drive transistor by its base-emitter junction which has a characteristically high breakdown voltage. Furthermore, input to the current amplifier is provided by an NPN transistor 110. The collector-emitter circuit of the NPN transistor 110 is an additional transient blocking junction in the absence of base drive current to the NPN transistor 110. The emitter of NPN transistor 110 is connected to ground. Large transients on the collector of the PNP output transistor 100 may be applied through the collector-base circuit of the PNP drive transistor 106 but will be blocked by the collector-emitter circuit of NPN transistor 110.

In order to switch on for a transitory period, a reverse drive current to the base of the PNP switching transistor 100, a capacitor 114 is shown in FIG. 1 connected between the base of the NPN transistor 110 and the input node. When the switching signal on the input node switches from a low state to a high state, a capacitor current is passed through the capacitor and amplified by the NPN transistor 110. The NPN transistor 110 also acts as an inversion device changing the direction of the current. The capacitor current comes into the base of NPN transistor 110 and an amplified current is produced by the NPN transistor that is pulled out of the base of the PNP drive transistor 106. This amplified current is amplified further in the PNP drive transistor 106 to produce the transitory reverse drive current to the base of the PNP transistor 100. In order to reset the capacitor 114 for the next cycle, a current passing element is coupled to the capacitor 114. The current passing element in FIG. 1 is the diode 112. Diode 112 is connected with its anode to ground and its cathode to the capacitor 114 and the base of NPN transistor 110.

The operation of the circuit of FIG. 1 will now be described. When the switching signal at the input node transitions from a low state to a high state, it will cause current to cease flowing in current source 104. This begins the turn-off process in the PNP switching transistor 100 by eliminating the base drive current to it. At the same time, the change in voltage at the input node will cause a capacitor current to flow in capacitor 114. The base current for NPN transistor 110 comes from capacitor 114. The capacitor current level is determined by the equation $I=C*dV/dT$, where I is the current flow in capacitor 114 going into the base of NPN transistor 110, C is the value of capacitor 114, dV is the chance in voltage across capacitor 114 and dT is the time duration of the input signal to go from the low to the high state. For typical values of C=10pF, dT=25 nanoseconds and dV=4 volts, the capacitor current will be 1.6 milliamps. This base current is multiplied by the beta of NPN transistor 110 and redirected as a collector current that drives the base of PNP transistor 106. The base drive in PNP transistor 106 is multiplied by beta and the resulting current which flows out from the collector of PNP transistor 106 drives into the base of PNP output transistor 100. The base drive to PNP transistor 100 is sourced from the collector of PNP drive transistor 106 for a short duration lasting only about 5 microseconds. During this transition, a diode 116 which in the preferred embodiment is a Schottky diode, also functions to speed up the turn-off time of the PNP drive transistor 106. The diode 116 is connected with its anode at the collector of the PNP drive transistor 106 and its cathode at the base of the PNP drive transistor 106. This allows a higher frequency of operation for the circuit by causing PNP drive transistor 106 to cease driving current into the base of PNP switching transistor 100 much sooner than if the diode 116 was not there. After the transitory reverse drive current drops off, resistor 108 continues to provide the bias needed to keep PNP transistor 100 in an off state for as long as the input remains in a high state.

With the input node at its low state, the voltage across capacitor 114 is less than the Vbe of the NPN transistor 110. In other words, it is under about 0.6 volts. The voltage across capacitor 114 after the input goes to the high state is equal to the high voltage minus the Vbe of the NPN transistor 110. For a high state of 5 volts and a Vbe of 0.7 volts, the voltage across the capacitor will be about 4.3 volts. During the low to high transition, current flow through the capacitor 114 is from the input terminal through capacitor 114 to the base of NPN transistor 110. When the cycle is to repeat, the switching signal of the input node will at some time go to a low state. During the high to low transition at the input node, current flow through the capacitor 114 starts from ground, flows through the diode 112 through capacitor 114 and out through the input terminal. The diode 112 thus provides a current path for capacitor current during the high to low transition.

Figure 2:
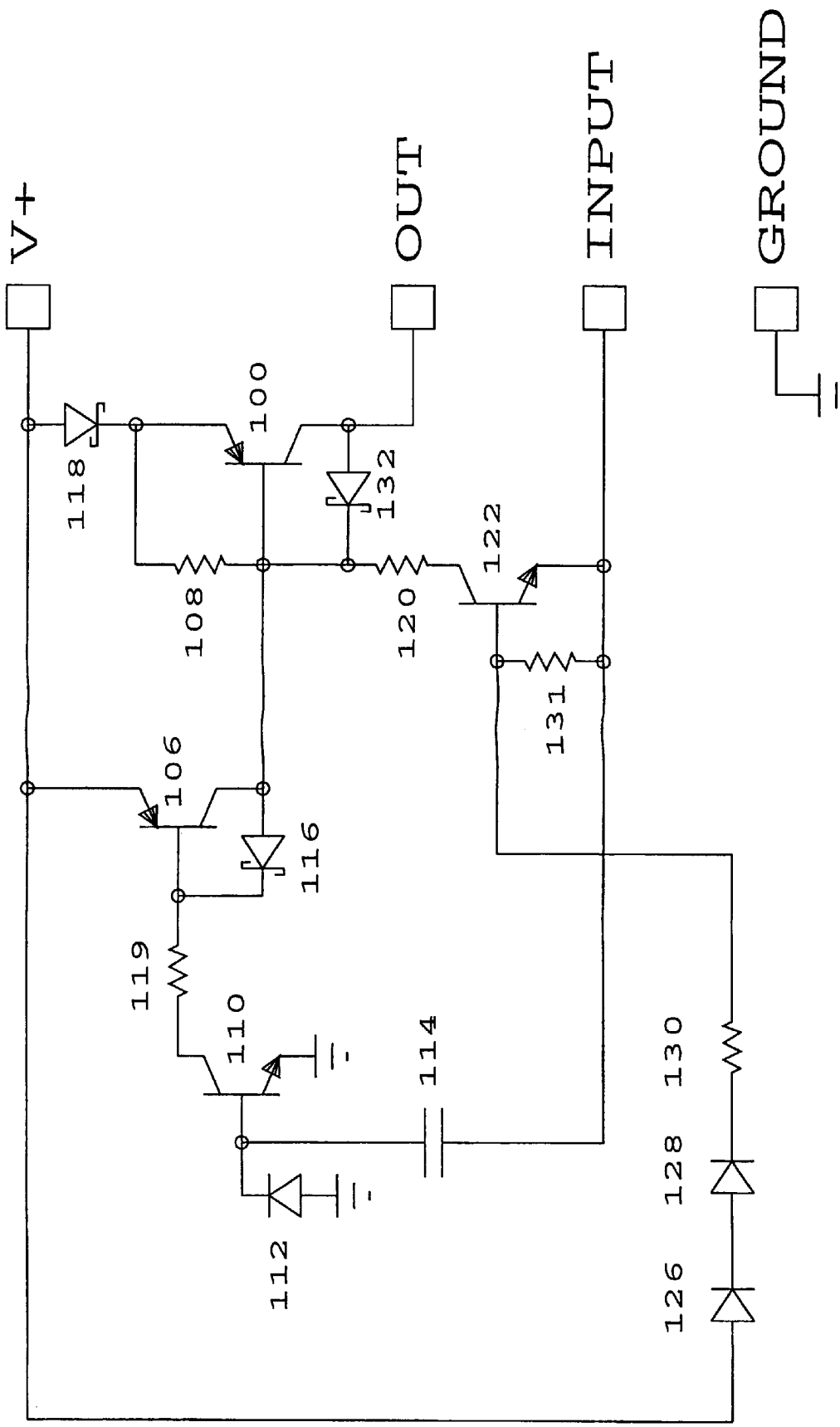
FIG. 2 is a schematic diagram of a second embodiment of the circuit of the invention.

In order to realize the full benefits of component protection from high voltage transients at the collector output of the PNP transistor 100, an additional diode 118 needs to be added between the voltage supply line and the emitter of the PNP transistor 100 as shown in FIG. 2. The anode of diode 118 is connected to the voltage supply line and the cathode of diode 118 is connected to the emitter of the PNP transistor 100. The operation of this diode will be described upon completing the description of the embodiment of FIG. 2.

A presently preferred current source includes an NPN switching transistor 122. The NPN switching transistor 122 goes into saturation when the switching signal on the input node goes low. It pulls a current determined in large part by the value of a resistor 120 coupled to the collector of the NPN switching transistor 122. The switching transistor 122 may be provided with a base-emitter resistor 131.

The trip point for switching the transistor 122 on or off is set with the assistance of one or more semiconductor junctions coupled between the positive voltage supply line and the base of the switching transistor 122. In the embodiment of FIG. 2, two diodes 126, 128 are connected in series between the positive voltage supply line and the base of switching transistor 122. A resistor 130, connected in series with the diodes 126, 128, also contributes to the trip point. In the embodiment of FIG. 2, the turn-on voltage of the switching transistor 122 is equal to the positive voltage on the voltage supply line minus the sum of the voltage across diode 126, the voltage across 128, the Vbe of the switching transistor 122 and the value of resistor 130 times the Vbe of the switching transistor 122 divided by the value of base-emitter resistor 131.

A Schottky diode 132 has been added between the base and collector terminals of PNP transistor 100 in order to reduce the level of stored charge in PNP transistor 100 while it is in the on state in order to reduce the delay time to the start of the turn-off transition. It does not, however, reduce the transition time from the on state to the off state. A resistor 119 is an optional addition to the circuit of FIG. 2 in order to limit the base drive available to the PNP drive transistor 106.

Transient protection shall now be described. In an automobile where long wire runs exist, inductive coupling of high energy transients from various electrical motors in the car can cause high voltage excursions on the order of ±40 volts on that long wire. When that wire is connected to the output of a driver transistor, such as PNP switching transistor 100, damage can be caused to the integrated circuit if precautions are not taken. Negative voltage transients are adequately protected against by the PNP switching transistor 100 itself. In accordance with the circuit of FIG. 2, a high positive voltage on the output terminal will not cause any damage to the components of the circuit or allow any of the energy of the high voltage transient to flow back into the positive voltage supply line and possibly damage other components external to the integrated circuit that share the positive voltage supply line. When a high voltage is applied to the output terminal, the collector-base junction of the PNP switching transistor 100 and the Schottky diode 132 are forward-biased. Current that could flow in this path is blocked from reaching the positive voltage supply line by the Schottky diode 118. Another path to the positive supply line is blocked by the reverse-biased base-emitter junction of the PNP drive transistor 106. A path to a second supply line, namely ground, is blocked by the reverse biased junction of the collector-emitter junction of NPN transistor 110. In the absence of a base drive current from capacitor 114, the NPN transistor 110 is in an "off" state effectively blocking high positive voltage transients.

Further, with respect to the Schottky diode 118. The Schottky diode 118 will block any current from flowing to the positive voltage supply line during a high voltage transient event. If the Schottky diode 118 is left out of the circuit as in FIG. 1, current will flow from the collector of the PNP switching transistor 100 to the positive voltage supply line through the PNP switching transistor 100. While the PNP switching transistor 100 would then be subject to possible damage, no other circuit elements in the PNP control circuit will be damaged. Normal operation can resume once the transient event is over. There may, however, be additional concern for external components due to the current added into the positive voltage supply line.

It is well within the scope of this invention to alter the sizes of the components to change the response times. The capacitor current can be varied by changing the size of the capacitor. The resulting current that flows into the base of NPN transistor 110 is high enough to cause the NPN transistor to operate in a region where its collector current is limited by the physical size of its emitter rather than by the nominal beta of the transistor. Operating in this region, the available current from the collector of NPN transistor 110 can be set by fixing the emitter area to some particular value. A large area will result in more collector current and therefore more base drive to PNP drive transistor 106. The amount of current sourced from the collector of the PNP drive transistor 106 determines the delay time to the start of the "off" state transition and to the duration of the "on" to "off" transition time. Setting the size of PNP drive transistor 106 will determine the level of collector current from it to discharge the stored base charge of PNP switching transistor 100. As with NPN transistor 110, the base current into the PNP drive transistor 106 is sufficiently high so that the transistor operates in a region where its collector current is limited by the physical size of the emitter and not by the nominal beta of the transistor. Because the transitory reverse base drive current is set mainly by device areas and not transistor betas, the rate of turnoff should be relatively insensitive to die temperature and wafer processing variations.

Figure 3:
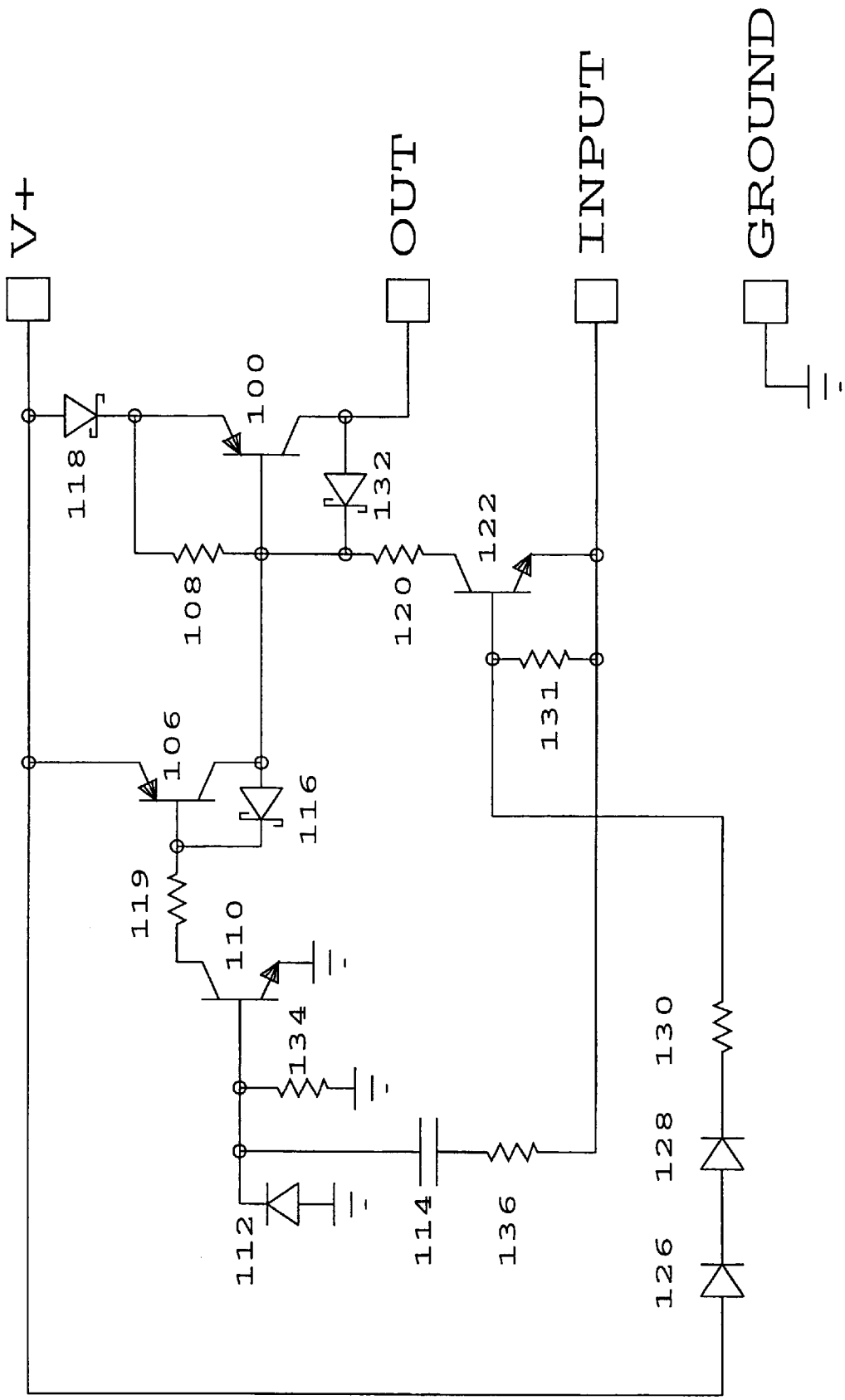
FIG. 3 is a schematic diagram of a third embodiment of the circuit of the invention.

Referring now to FIG. 3, additional components may be added to modify the operation of the circuit. A base-to-emitter resistor 134 may be added across NPN transistor 110 to improve the collector break down voltage capability of that device. A resistor, 136 may be connected in series with capacitor 114 to stretch out or prolong the current pulse into the base of the NPN transistor 110. This would increase the duration of the reverse base drive current into the PNP switching transistor 100.

It should be understood that various changes and modifications to the preferred embodiments described above will be apparent to those skilled in the art. For example, the switching signal may be provided to an input node that lacks an input pin or terminal. This and other changes can be made without departing from the spirit and scope of the invention and without diminishing its attendant advantages. It is therefore intended that such changes and modifications be covered by the following claims.

I claim:

1. A fast turn-off PNP transistor control circuit with output transient protection comprising:

a first supply line for providing a positive supply to the PNP transistor;

a current source coupled to a base of the PNP transistor for driving the PNP transistor in response to a switching signal;

a current amplifier, having a first transient blocking junction coupled between said first supply line and the base of the PNP transistor, for providing a transitory reverse drive current to the base of the PNP transistor when the switching signal switches from a first state to a second state to speed up the turn-off of the PNP transistor; and an input device for providing an input current to said current amplifier, said input device including a second transient blocking junction coupled between the base of the PNP transistor and a second supply line, the transient blocking junction having an inactive state in which current flow from a positive voltage transient at the collector of the PNP transistor is blocked from the second supply line.

2. The fast turn-off PNP transistor control circuit of claim 1 wherein said second supply line is connected to ground.

3. The fast turn-off PNP transistor control circuit of claim 1 further comprising a resistor, connected between the emitter of said PNP transistor and the base of said PNP transistor, and a diode, having an anode coupled to said first supply line and a cathode coupled to an emitter of the PNP transistor and to said resistor, for blocking positive voltage transients.

4. The fast turn-off PNP transistor control circuit of claim 1 wherein said current source comprises an NPN transistor having an emitter for receiving the switching signal, a base and a collector coupled to the base of the PNP transistor.

5. The fast turn-off PNP transistor control circuit of claim 4 further comprising at least one semiconductor junction coupled between said first supply line and the base of said NPN transistor for setting a trip point voltage for said NPN transistor.

6. The fast turn-off PNP transistor control circuit of claim 1 further comprising a capacitor coupled to said input device for passing a current when the switching signal switches from the first state to the second state which activates said input device to provide the input current to said current amplifier which produces the reverse drive current.

7. The fast turn-off PNP transistor control circuit of claim 6 further comprising a current passing element coupled between the second supply line and said capacitor for supplying a current to said capacitor when the switching signal switches from the second state to the first state.

8. The fast turn-off PNP transistor control circuit of claim 6 further comprising a resistor connected in series with said capacitor so as to increase duration of the current passed by said capacitor.

9. The fast turn-off PNP transistor control circuit of claim 1 wherein said current amplifier comprises a PNP drive transistor having an emitter coupled to said first supply line, a collector coupled to the base of the PNP transistor and a base and wherein the first transient blocking junction comprises a base-emitter junction of said PNP drive transistor.

10. The fast turn-off PNP transistor control circuit of claim 9 further comprising a diode having an anode connected to the collector of said PNP drive transistor and a cathode connected to the base of said PNP drive transistor.

11. The fast turn-off PNP transistor control circuit of claim 9 wherein said input device comprises an NPN transistor and the second transient blocking junction comprises a collector-emitter circuit of said NPN transistor.

12. The fast turn-off PNP transistor control circuit of claim 11 further comprising a resistor connected in parallel with a base-emitter circuit of the NPN transistor so as to improve upon breakdown voltage capability of the NPN transistor.

13. A PNP transistor control circuit with fast turn off comprising:

a voltage supply line for providing a positive voltage to the PNP transistor;

a current source, coupled between a base of the PNP transistor and an input node, for driving the PNP transistor when a switching signal on the input node is in a first state;

a PNP drive transistor having an emitter coupled to said voltage supply line, a collector coupled to a base of the PNP transistor and a base;

a capacitor coupled between the input node and the base of said PNP drive transistor in parallel with said current source, said capacitor passing a capacitor current when the switching signal on the input node switches from the first state to a second state, wherein said PNP drive transistor applies a reverse drive current to the base of the PNP transistor in response to the capacitor current.

14. The fast turn-off PNP transistor control circuit of claim 13 further comprising a diode having an anode connected to the collector of said PNP drive transistor and a cathode coupled to the base of said PNP drive transistor.

15. The fast turn-off PNP transistor control circuit of claim 13 further comprising a current passing element coupled between ground and said capacitor for supplying a current to said capacitor when the switching signal switches from the second state to the first state.

16. The fast turn-off PNP transistor control circuit of claim 13 further comprising a resistor connected in series with said capacitor so as to increase duration of the capacitor current.

17. The fast turn-off PNP transistor control circuit of claim 13 further comprising a resistor, connected between the emitter of said PNP transistor and the base of said PNP transistor, and a diode having an anode coupled to said voltage supply line and a cathode coupled to an emitter of the PNP transistor.

18. The fast turn-off PNP transistor control circuit of claim 13 further comprising an NPN transistor having a collector coupled to the base of said PNP drive transistor, a base coupled to said capacitor and an emitter coupled to ground for amplifying the capacitor current and providing the amplified capacitor current to the base of said PNP drive transistor.

19. The fast turn-off PNP transistor control circuit of claim 18 further comprising a diode having an anode coupled to ground and a cathode coupled to the base of said NPN transistor for supplying a current to said capacitor when the switching signal switches from the second state to the first state.

20. The fast turn-off PNP transistor control circuit of claim 13 wherein said current source comprises an NPN transistor having an emitter connected to the input node, a base and a collector coupled to the base of the PNP transistor.

21. The fast turn-off PNP transistor control circuit of claim 20 further comprising at least one semiconductor junction coupled between said voltage supply line and the base of said NPN transistor for setting a trip point voltage for said NPN transistor.

22. The fast turn-off PNP transistor control circuit of claim 13 further comprising a current inversion device coupled between said capacitor and the base of said PNP drive transistor for pulling a base drive current from said PNP drive transistor in response to the capacitor current.

23. The fast turn-off PNP transistor control circuit of claim 22 wherein said current inversion device comprises an NPN transistor having a collector-emitter circuit coupled between the base of the PNP drive transistor and ground, the collector-emitter circuit, in the absence of the capacitor current, blocking current flow from a positive voltage transient at the collector of the PNP transistor in excess of the positive voltage.

24. The fast turn-off PNP transistor control circuit of claim 23 further comprising a resistor connected in parallel with a base-emitter circuit of the NPN transistor so as to improve upon breakdown voltage capability of the NPN transistor.

25. A PNP transistor control circuit with fast turn off comprising:
- a voltage supply line for providing a positive voltage to the PNP transistor,
- a current source, coupled between a base of the PNP transistor and an input node, for driving the PNP transistor when a switching signal on the input node is in a first state;
- a PNP drive transistor having an emitter coupled to said voltage supply line, a collector coupled to a base of the PNP transistor and a base;
- an NPN transistor having collector-emitter circuit coupled to the base of said PNP drive transistor and a base; and
- a capacitor coupled between the input node and the base of said NPN transistor, said capacitor passing a capacitor current when the switching signal on the input node switches from the first state to a second state and wherein said NPN transistor and said PNP drive transistor amplify the capacitor circuit to provide a reverse drive current to the base of the PNP transistor that speeds up the turning off of the PNP transistor.

26. The fast turn-off PNP transistor control circuit of claim 25 further comprising a resistor coupled between the base of said NPN transistor and the emitter of said NPN transistor so as to improve upon breakdown voltage capability of said NPN transistor.

27. The fast turn-off PNP transistor control circuit of claim 25 wherein the first state is low and the second state is high.

28. The fast turn-off PNP transistor control circuit of claim 25 further comprising a first diode having an anode connected to the collector of said PNP drive transistor and a cathode coupled to the base of said PNP drive transistor.

29. The fast turn-off PNP transistor control circuit of claim 28 further comprising a second diode having an anode coupled to said voltage supply line and a cathode coupled to an emitter of the PNP transistor.

30. The fast turn-off PNP transistor control circuit of claim 25 wherein said current source comprises an NPN transistor having an emitter connected to the input node, a base and a collector coupled to the base of the PNP transistor.

31. The fast turn-off PNP transistor control circuit of claim 30 further comprising at least one semiconductor junction coupled between said voltage supply line and the base of said NPN transistor for setting a trip point voltage for said NPN transistor.

32. The fast turn-off PNP transistor control circuit of claim 25 further comprising a current passing element coupled between ground and said capacitor for supplying a current to said capacitor when the switching signal switches from the second state to the first state.

33. The fast turn-off PNP transistor control circuit of claim 32 wherein said current passing element comprises a diode having an anode coupled to ground and a cathode coupled to said capacitor and to the base of said NPN transistor.

34. The fast turn-off PNP transistor control circuit of claim 33 further comprising a resistor connected in series with said capacitor so as to increase duration of the capacitor current.

35. A fast turn-off PNP transistor control circuit with output transient protection comprising:
- a first supply line for providing a positive supply to the PNP transistor;
- a current source coupled to a base of the PNP transistor for driving the PNP transistor in response to a switching signal:
- a current amplifier, having a first transient blocking junction coupled between said first supply line and the base of the PNP transistor, for providing a transitory reverse drive current to the base of the PNP transistor when the switching signal switches from a first state to a second state to speed up the turn-off of the PNP transistor; and
- an input device for providing an input current to said current amplifier, said input device including a second transient blocking junction coupled between the base of the PNP transistor and ground.

36. The fast turn-off PNP transistor control circuit of claim 35 wherein said current amplifier comprises a PNP drive transistor having an emitter coupled to said first supply line, a collector coupled to the base of the PNP transistor and a base and wherein the first transient blocking junction comprises a base-emitter junction of said PNP drive transistor.

37. The fast turn-off PNP transistor control circuit of claim 36 wherein said input device comprises an NPN transistor and the second transient blocking junction comprises a collector-emitter circuit of said NPN transistor.

38. A fast turn-off PNP transistor control circuit with output transient protection comprising:
- a first supply line for providing a positive supply to the PNP transistor;
- a current source coupled to a base of the PNP transistor for driving the PNP transistor in response to a switching signal, said current source comprising an NPN transistor having an emitter for receiving the switching signal, a base and a collector coupled to the base of the PNP transistor;
- a current amplifier, having a first transient blocking junction coupled between said first supply line and the base of the PNP transistor, for providing a transitory reverse drive current to the base of the PNP transistor when the switching signal switches from a first state to a second state to speed up the turn-off of the PNP transistor: and
- an input device for providing an input current to said current amplifier, said input device including a second transient blocking junction coupled between the base of the PNP transistor and a second supply line.

39. The fast turn-off PNP transistor control circuit of claim 38 further comprising at least one semiconductor junction coupled between said first supply line and the base of said NPN transistor for setting a trip point voltage for said NPN transistor.

* * * * *